US006307381B1

(12) United States Patent
Dalichau et al.

(10) Patent No.: US 6,307,381 B1
(45) Date of Patent: Oct. 23, 2001

(54) HIGH VOLTAGE INSTALLATION WITH A DEVICE FOR TRANSMITTING SIGNALS

(75) Inventors: Harald Dalichau, Vaterstetten; Jörg Gorablenkow, Berlin; Christian Korden, München; Klaus Lange, Putzbrunn; Thomas Ostertag, Finsing; Gerd Scholl, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/381,022

(22) PCT Filed: Mar. 13, 1998

(86) PCT No.: PCT/DE98/00807

§ 371 Date: Feb. 4, 2000

§ 102(e) Date: Feb. 4, 2000

(87) PCT Pub. No.: WO98/40753

PCT Pub. Date: Sep. 17, 1998

(30) Foreign Application Priority Data

Mar. 14, 1997 (DE) .............................................. 197 11 990

(51) Int. Cl.[7] ..................................................... G01R 31/08

(52) U.S. Cl. ............................................ 324/536; 343/772

(58) Field of Search ............................. 343/772; 324/536, 324/555, 455, 456, 501, 629, 632, 687, 72; G01R 31/08

(56) References Cited

U.S. PATENT DOCUMENTS 4,277,746 * 7/1981 Abe et al. .............................. 324/72
5,146,170 * 9/1992 Ishikawa et al. ..................... 324/536
5,256,976 * 10/1993 Ishikawa et al. ..................... 324/522
5,804,972 * 9/1998 de Kock et al. ...................... 324/536

FOREIGN PATENT DOCUMENTS 31 30 643 2/1983 (DE) .
0 134 187 3/1985 (EP) .
0 730 160 9/1996 (EP) .
90 11530 10/1990 (WO) .
95 29553 11/1995 (WO) .
97 28591 8/1997 (WO) .

OTHER PUBLICATIONS

Osmokrovic, P. et al., "Measuring Probe for Fast Transients Monitoring in Gas Insulated Substation," IEEE Transactions on Instrumentation and Measurement, Bd. 46, Nr. 1, Feb. 1997, pp. 36–44.

Pack, S. et al., "PD Signal Propagation in GIS Considering Frequencies up to GHz"; 8$^{th}$ International Symposium on High Voltage Engineering, Yokoham, Japan, Aug. 23–27, 1993, pp. 93–96.

Pearson, J.S. et al., "A Continous UHF Monitor for Gas–Insulated Substations," IEEE Transactions on Electrical Insulation, vol. 26, No. 3, Jun. 1991, pp. 459–478.

Judd, M.D. et al., "Broadband Couplers for UHF Detection of Partial Discharge in Gas–Insulated Substations", IEE Proc.–Sci. Meas. Technol., vol. 142, No. 3, May 1995, pp. 237–243.

Meinke Gundlach, "Taschenbuch der Hochfrequenztechnik," Springer–Verlag, 5$^{th}$ edition, Ch. 4, p. N 15, 1992. Described in Specification.

* cited by examiner

*Primary Examiner*—Don Wong
*Assistant Examiner*—Shih-Chao Chen
(74) *Attorney, Agent, or Firm*—Kenyon & Kenyon

(57) ABSTRACT

In a high-voltage installation having at metallic encapsulating housing, a cone antenna is provided as a device for transmitting electromagnetic signals. The cone tip antenna facing the inner wall of the encapsulating housing resulting in an optimal coupling characteristic.

8 Claims, 1 Drawing Sheet

HIGH VOLTAGE INSTALLATION WITH A DEVICE FOR TRANSMITTING SIGNALS

FIELD OF THE INVENTION

The present invention relates to a high-voltage installation having a metallic encapsulating housing that encloses at least one high-voltage conductor, and a device for transmitting electromagnetic signals, in particular for communication and/or monitoring the high-voltage installation, having a probe arranged in the interior of the encapsulating housing.

BACKGROUND INFORMATION

A high-voltage installation of this type is described in articles "PD Signal Propagation in GIS Considering Frequencies up to GHz," 8th International Symposium on High Voltage Engineering Yokohama, Japan, pp. 93–96, "A Continuous UHF-Monitor for Gas-insulated Substations," IEEE Transactions on Electrical Insulation Vol. 26, No. 3, June 1991, pp. 469–478, and "Broadband Couplers for UHF Detection of Partial Discharge in Gas-Insulated Substations," IEE Proc.-Sci. Meas. Technol., Vol 142, No. 3, May 1995, p. 237–293.

PCT Patent No. 95/29553 describes a power cable that has a sensor enclosed by the cable sheath. Here various cable characteristics, such as the voltage drop, the temperature, or the pressure, are to be monitored by the sensor.

German Patent No. 31 30 643 describes a conventional coupling arrangement for coupling the carrier frequency message installations to high voltage potential. European Patent No. 0 134 197 describes a probe for the acquisition of partial discharges with a plate-shaped sensor that is insulated from the encapsulating housing, and a slot antenna in the form of an annular gap formed between the plate and the encapsulating housing. On the side of the plate facing away from the interior of the encapsulating installation, a conical member is provided for matching the characteristic impedance to a measurement line.

European Patent No. 0 730 160 describes a similar partial discharge measurement device with a sensor plate that likewise forms an annular slot antenna together with the wall of the encapsulating housing. An element for matching the characteristic impedance is also provided on the side of the plate facing away from the interior of the encapsulating installation.

In conventional devices for transmitting electromagnetic signals, in most cases disk-shaped probes are used as antennas or as capacitive voltage dividers.

Since, for reasons of field formation, such disk-shaped probes must lie as flat as possible on the inner wall of the encapsulating housing, a transceive characteristic results that on the one hand is not sufficiently broadband with regard to the desired frequency range—that is, in the range of the high frequencies only narrow useful bands result—while on the other hand the axis of symmetry of the disk represents the direction of greatest transmission strength or, respectively, reception sensitivity, so that signals propagated laterally, that is, radially in relation to the disk are coupled relatively weakly.

SUMMARY

The present invention is thus based on the object of creating a high-voltage installation of the type named above, having a device for transmitting electromagnetic signals, and a broadband probe.

The object is achieved according to the present invention in that the probe has a conical member (cone antenna) whose base surface faces the high-voltage conductor and whose cone tip faces the inner wall of the encapsulating housing.

The conical member forms a conventional cone antenna inside the encapsulating housing, having the conventional broadband frequency characteristic thereof. What is concerned here is an asymmetrically excited cone line (cf. Meinke Grundlach, "Taschenbuch der Hochfrequenztechnik," Springer-Verlag, 5th ed., ch. 4, p. N15, 1992), so that no baluns are required for connection to a coaxial line whose outer conductor is grounded.

The matching of the base impedance of the conical member to the characteristic impedance of a cable to be connected takes place via the apex angle of the cone.

The geometrical emission characteristic of the cone antenna favors an emission via the cone jacket surface, i.e., in the given case, along the walls of the encapsulating housing. If the cone antenna is arranged inside a cylindrical tube-shaped encapsulating housing, then the propagation of signals emitted by the cone antenna takes place predominantly in the axial direction of the tube. Signals from other sources propagating in this direction are picked up by the cone antenna with a greater broadband and higher sensitivity.

Through the broadband coupling to waveguide modes (hollow conductor types) capable of propagation, the cone antenna makes possible an effective monitoring of the high-voltage installation, for example with regard to signals of partial discharge processes.

In the arrangement according to the present invention, the capacitive coupling of the cone antenna to the high-voltage conductor via the cone base surface is also particularly effective. Capacitive voltage pick-off (operation as a capacitive voltage divider) and antenna operation can take place in alternating fashion, or also simultaneously, according to the wiring.

However, it is also possible to send or to receive communication signals via the cone antenna, so that communication is possible over large distances within the encapsulating housing, for example hundreds of meters. The interrogation of surface wave elements via signals emitted by the cone antenna is also conceivable.

For the case in which the cone antenna is arranged in a housing support placed at the perimeter of the encapsulating housing, an arrangement can also be advantageous in which the cone axis of the cone antenna is arranged parallel to the plane of the wall of the encapsulating housing, and thus perpendicular to the direction in which the housing support runs.

An advantageous embodiment of the present invention provides that the conical member has a cone apex angle of approximately 90°.

A cone apex angle of approximately 90° leads to a base impedance in the region of 50 ohms, which then corresponds to the characteristic impedance of the standardly used coaxial line. This makes possible a loss-free coupling of the cone antenna to a coaxial line.

Another embodiment of the present invention provides that the conical member is arranged in a radial bulge [curved projection] of the encapsulating housing, in such a way that the base surface of the conical member fits into the imagined continuation of the inner contour of regions of the encapsulating housing that are adjacent to the indentation.

This embodiment of the present invention enables the emission and reception of electromagnetic signals in the radial direction in relation to the cone antenna, without the conical member protruding too far into the interior of the encapsulating housing. In this way, the risk of an electrical sparkover from the high-voltage conductor to the cone antenna is reduced. The conical member can, for example be arranged in a cable gland of the encapsulating housing. This facilitates both the maintenance of the cone antenna and the gas-tight ducting through of the coaxial cable.

For reasons of field formation and for the avoidance of partial discharges, it can be advantageous for the conical member to be rounded at the perimeter of its base surface.

An additional advantageous embodiment of the present invention provides that the conical member is supported by a plurality of insulating supports in the area of its jacket surface.

Through this construction, a reliable fastening of the conical member is possible without adversely affecting the emission characteristic. The reliable fastening is necessary insofar as strong vibrations can affect the high-voltage installation during transport, an earthquake or a switching operation.

An additional advantageous embodiment of the present invention provides that the conical member is constructed so as to be hollow and divisible parallel to its base surface.

Through the divisible construction of the conical member, the fastening to the wall of the encapsulating housing is made particularly simple. The element can also be constructed as a one-piece hollow cast part in which the base surface is left open. This permits an economical manufacturing.

The conical member may also be held, in the area of its cone tip, in an insulating element fastened to the encapsulating housing.

Such a fastening of the conical member presents a particularly low construction and assembly cost.

The cone tip of the conical member can advantageously be connected immediately to the inner conductor of a coaxial line.

No electrical matching elements, for example baluns, are required for the connection between the antenna and the coaxial line. Mechanical coupling may be provided using mechanical coupling a plug, connected with the tip of the conical member, that can be plugged into a socket that is fitted in gas-tight fashion into the wall of the encapsulating housing; this socket is connected with the coaxial line on the outside of the encapsulating housing.

DETAILED DESCRIPTION

Figure 1:
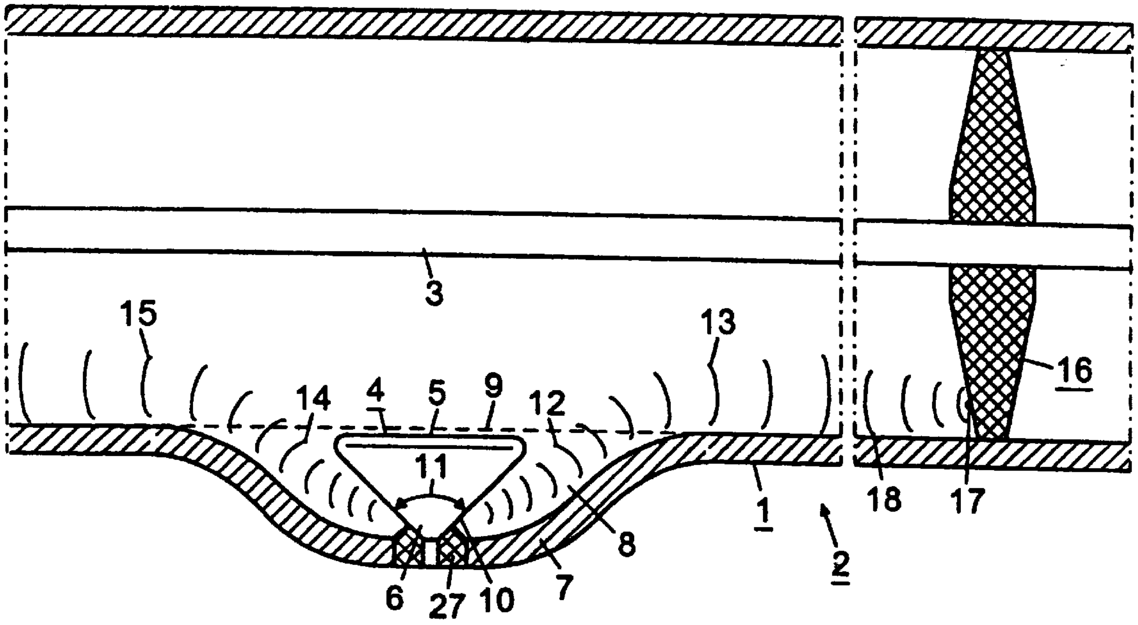
FIG. 1 shows a schematic of an interior of an encapsulating housing of a high-voltage installation having a conical member.

In cylindrical encapsulating housing 1—coaxially enclosing a high-voltage conductor 3—of a high-voltage installation 2, a conical member 4 is arranged whose base surface 5 faces high-voltage conductor 3, while tip 6 faces wall 7 of the encapsulating housing.

For this purpose, encapsulating housing 1 has an indentation 8 in which conical member 4 is arranged in such a way that its base surface 5 is fitted approximately into inner contour 9, which is shown in broken lines, of encapsulating housing 1. Conical member 4 is rounded at the perimeter of its base surface 5, because of field formation and to avoid sparkover. The angle between cone jacket surface 10 and wall 7 of the encapsulating housing is approximately 45°. Cone angle 11 of conical member 4 is approximately 90°.

FIG. 1 indicates the geometrical emission characteristic of conical member 4, which forms a cone antenna, by wave fronts 12, 13, 14, 15. These wave fronts propagate, at some distance from the cone antenna, in the axial direction of cylindrical encapsulating housing 1. In the representation shown in FIG. 1, the wave fronts are shown during a transmission operation of the antenna. However, the cone antenna can also receive correspondingly propagated electromagnetic signals that can for example be emitted by partial discharges in a remote support 16 made of insulating material, if for example a particle 17 has settled on its surface. The emitted partial discharge signals that then arise are shown, for example, by wave fronts 18. These are detected with high sensitivity by cone antenna 4.

Figure 2:
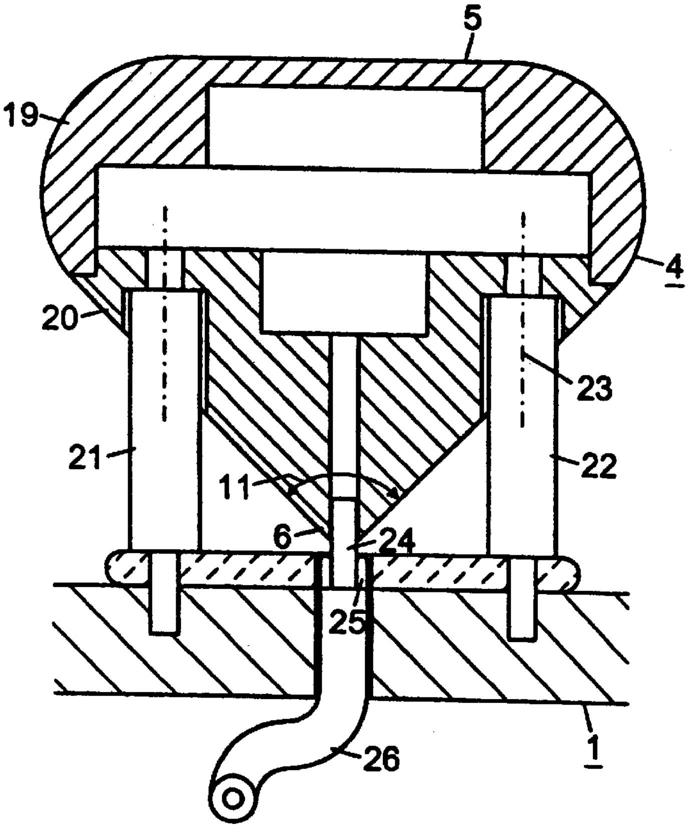
FIG. 2 shows a cross-sectional view of a conical member

FIG. 2 shows that conical member 4 is divided into an upper part 19 and a lower part 20. Lower part 20 is supported and fastened to wall 1 of the encapsulating housing by insulating supports 21, 22. For this purpose, lower part 20 of conical member 4 is screwed to insulating supports 21, 22 by screws 23.

Subsequently, upper part 19 of conical member 4 can be put in place and fixed, for example by a press-fitting or a screwed connection. Tip 6 of conical member 4 tapers to a pin 24 that is held in a corresponding opening 25 in a bushing pocket of wall 1 of the encapsulating housing. From there, there is a conductive connection to coaxial line 26, whose outer conductor is connected with encapsulating housing 1, while the inner conductor is connected conductively with conical member 4. The characteristic impedance of this coaxial line 26 is 50 ohms. The detection electronics for partial discharge measurement signals to be received, or the transceive electronics for the installation communication of the high-voltage installation, are connected to this coaxial line 26.

What is claimed is:

1. A high-voltage installation comprising:

a metallic encapsulating housing enclosing at least one high voltage conductor; and a transmitter for transmitting electromagnetic signals, the transmitter providing at least one of communication with the high-voltage installation and monitoring of the high-voltage installation, the transmitter including a probe arranged in an interior of the metallic encapsulating housing, the probe including a conical member, the conical member having a base surface and a cone tip, the base surface facing the at least one high-voltage conductor, the cone tip facing an inner wall of the metallic encapsulating housing.

2. The high-voltage installation according to claim 1, wherein the conical member has a cone apex angle approximately equal to 90°.

3. The high-voltage installation according to claim 1, wherein the metallic encapsulating housing has an inner contour adjacent to a curved projection, the conical member being arranged in the radial bulge so that the base surface is fitted into the inner contour of the metallic encapsulating housing.

4. The high-voltage installation according to claim 1, wherein the conical member is rounded at a perimeter of the base surface.

5. The high-voltage installation according to claim 1, wherein the conical member has a jacket surface, the conical member being supported on the inner wall by a plurality of insulating supports, in an area of the jacket surface.

6. The high-voltage installation according to claim 1, wherein the conical member is hollow and divisible parallel to the base surface.

7. The high-voltage installation according to claim 1, wherein the conical member is held, in an area of the cone tip, in an insulating element, the insulating element being fastened to the encapsulating housing.

8. The high-voltage installation according to claim 1, wherein the cone tip is joined directly to an inner conductor of a coaxial line.

* * * * *